United States Patent [19]

Higgins, III

[11] Patent Number: 5,492,863
[45] Date of Patent: Feb. 20, 1996

[54] METHOD FOR FORMING CONDUCTIVE BUMPS ON A SEMICONDUCTOR DEVICE

[75] Inventor: Leo M. Higgins, III, Austin, Tex.

[73] Assignee: Motorola, Inc., Schaumburg, Ill.

[21] Appl. No.: 324,824

[22] Filed: Oct. 19, 1994

[51] Int. Cl.[6] .................................... H01L 21/44
[52] U.S. Cl. .................. 437/183; 437/189; 437/186; 437/187; 437/928
[58] Field of Search .................. 437/183, 189, 437/186, 187, 928, 935, 936; 430/326

[56] References Cited

U.S. PATENT DOCUMENTS

| | | | |
|---|---|---|---|
| 5,024,969 | 6/1991 | Reche | 437/928 |
| 5,059,513 | 10/1991 | Hopf et al. | 430/326 |
| 5,086,558 | 2/1992 | Grube et al. | 29/832 |
| 5,093,225 | 3/1992 | Holmstrom et al. | 437/928 |
| 5,196,371 | 3/1993 | Kulesza et al. | 437/183 |

Primary Examiner—Brian E. Hearn
Assistant Examiner—Kevin M. Picardat
Attorney, Agent, or Firm—Patricia S. Goddard

[57] ABSTRACT

Conductive bumps (24) are formed on a semiconductor device (10) by applying or depositing an imageable conductive layer (18) over the device and in contact with I/O pads of a final metallization layer (14). The imageable conductive material is formed of an imageable acrylic resin system filled with conductive particles. In one embodiment, a mask (20) having a pattern of transparent material (21) corresponding to the desired patterned of conductive bumps is used to expose the imageable conductive layer to radiation (23). The imageable conductive layer is then developed, thereby removing unexposed portions of the layer and leaving a plurality of conductive bumps (24) on the I/O pads of the device. Rather than using a negatively imaged conductive layer, a positive resin could be used in formulating the imageable conductive material.

17 Claims, 3 Drawing Sheets

METHOD FOR FORMING CONDUCTIVE BUMPS ON A SEMICONDUCTOR DEVICE

FIELD OF THE INVENTION

The present invention relates generally to semiconductor device formation, and more specifically to methods for forming conductive bumps on semiconductor devices.

BACKGROUND OF THE INVENTION

The ability to form an array of input/output (I/O) terminals across the surface of a semiconductor die, such as an integrated circuit (IC), at low cost and with little technological investment is very desirable to both IC manufacturers and end users. Some ICs are interconnected to the next level system through the use of tiny gold or aluminum wires. Wire bonded devices are currently the most prevalent, and wire bonding is the least expensive manner of interconnecting the IC to the outside world. However, an increasing number of ICs utilize metal bumps as I/O interconnects instead of wire bonds because metal bumps eliminate the electrical parasitics associated with wire bond loops. Die with bump I/O interconnects may also reduce the system level footprint of the IC. Most commonly, metal bumps are made of a lead-tin solder. The solder bumps are melted in contact with the system level interconnect to form a physical and electrical connection. Less commonly, the metal bumps are made of gold, nickel, or some combination of metals, such as lead-tin solder over a copper base, or gold-plated nickel bumps.

Metal bumps can be formed by a variety of processes, including evaporation of lead and tin, electroplating of gold, electroplating of copper and lead-tin solder, thermosonic gold wire ball bumping, and lead-tin solder wire bumping. Evaporation of lead and tin is one of the more prevalent bumping processes, but has several drawbacks. For example, the use of lead in the solder bumps is a potential environmental hazard due to lead toxicity, and expensive waste remediation is involved in the processing. Also, lead-tin solder bumps require from 183°–370° C. for the joining operation to the next level of interconnect. This temperature range imposes limits upon the materials of construction of the substrate to which the IC can be joined.

Gold and solder bumps can also be formed from wire stock, using extensions of standard wire bonding technology. The chief difference in using wires for bumping, as opposed to standard wire bonding, is that after a ball bond (the first bond in a conventional wire bonding process) is formed, a wire loop to a stitch bond (the second bond in a conventional wire bonding process) is not formed. Instead, the wire is broken off just above the initial ball bond, leaving a metal ball on the bond pad. If gold wire is used, it may be desirable to subsequently flatten the metal ball, which often includes a small protruding wire tail. If solder wire is used in a bump process, a heating operation may be used to melt the bumps, eliminating the tiny wire tail which melts and spheroidizes with the base ball. Like evaporative techniques, bumping processes involving wire bonding have disadvantages. One disadvantage is that the pitch of ball bumps formed from wire is limited to the ball bumping process pitch limitations of about 150 μm. Another limitation of ball bumping may be imposed by the need to use compressive force, ultrasonic energy, and heat which may be needed to form the gold or solder bump. Ball bumping may limit the location of the bumps to sites which are not located above active circuitry of the IC due to the stresses imposed upon the structure during the bonding process. Also, wire ball bumping is undesirable in that it is generally better to ball bump individual die instead of entire wafers. This is due oxidation of bond pads in wafer regions which are bonded last, and the formation of excessive bump-to-bond pad reaction phase or phases on wafer regions which are bumped first. Oxidation or excess bond reaction phase can degrade bump adhesion. Throughput of ball bumping is also a disadvantage as compared to processes wherein the entire wafer can be processed in one process module.

Of all the currently available bumping technologies, only electroplating is capable of forming bumps with bump centerline spacings of less than, or equal to, 100 μm. The evaporative techniques discussed above historically have been used to form bumps at a 250 μm pitch. Recent developmental work using evaporation has reported pitches at 200 μm and 150 μm, which is generally accepted as the practical limit of evaporative processes. Electroplating processes for bump formation do not use the mechanical masking characteristic of the evaporative process. Instead, photoresist materials need to be applied to the wafer surface, and openings are formed in the resist in locations where bumps are to be plated. A disadvantage associated with electroplating processes to form bumps is that thin film deposition of bond pad barrier metals (typically titanium, tungsten, platinum, palladium, or chromium), must occur prior to the electroplating operation. In some instances, an electroless nickel/gold process may be used to form the bumps. In this instance, the thin film deposition may be avoided, but another operation involving the use of a highly alkaline zincate solution must be used to allow the subsequent electroless nickel plating process to perform properly, and for the deposited nickel to adhere well to the aluminum-based bond pad. These extra processing steps add cost, both in terms of material costs and decreased throughput.

Attempts to produce conductive thermoset epoxy bumps have also been reported. The bumps are formed by screen, or stencil, printing of the conductive epoxy onto the metal bond pads, followed by a partial curing of the epoxy bumps. Subsequent heating of the these bumped die, with bumps in contact with the conductors on the next level of interconnect, causes softening of the epoxy and adhesion to the contact pads to form the electrical connection. The formation of thermoset epoxy I/O bumps via a conventional screen printing process is limited by the relatively coarse ability of this process to control bump dimensions. The location, height, diameter, and cross-sectional shape of conductive epoxy bumps are difficult to control with screen or stencil printing processes.

Despite the variety of means available for forming conductive bumps for IC interconnection, a need exists for an improved process. Particularly desirable would be a process which is inexpensive, which is simple enough to be done by either the semiconductor manufacturer or end user of an IC, which does not involve elaborate thin film processing, which can be done at the wafer level for adequate throughput, which will allow low temperature processing, and which can achieve fine pitch spacings demanded in future generation devices.

DETAILED DESCRIPTION OF A PREFERRED EMBODIMENT

Generally, the present invention described herein is a method for forming conductive bumps on an IC using a radiation imageable conductive polymer in conjunction with lithographic processing techniques. One example of a suitable imageable material is a photosensitive acrylic resin system filled with conductive particle fillers and solvents as needed. A suitable resin system can be a positive or negative acting imageable material. In one embodiment of the invention, the filled resin system forming the imageable material is applied to an IC wafer surface, using techniques which may include spin-on, curtain coating, spraying, or film lamination techniques. The imageable material is then dried to remove solvents and attain mechanical stability. The material is then radiation imaged, preferably photo-imaged, using a mask appropriate for the type of radiation used. A subsequent development process removes appropriate portions of the imageable material, thereby defining small columnar regions of conductive material on I/O contact pads across the die surface. After development, an addition partial cure heat treatment may be done. The wafer is then diced to form the individual IC die. The die may then be positioned with the bumps in contact with contact pads on the next level interconnection substrate. Heat treatments adhesively join and cure the imageable polymer bumps and any underfilling material which may be used.

Advantages of the present invention include the fact that use of the imageable conductive polymer system does not require thin film barrier metal layers between the conductive bumps and the IC's metal I/O pads, permitting significant cost reduction. Further, the lithographic processing methods used allow for the formation of small interconnect bumps at pitches which are equivalent to, or finer than, those permitted with electroplating. Moreover, the invention allows wafer level processing wherein all die on a wafer are processed simultaneously for increased throughput and cost reduction. Another advantage is that the application of the conductive polymer to the wafer and the subsequent lithographic processing involves straight forward processing technologies, without need for knowledge of the elaborate techniques unique to evaporative or electroplated bump technology.

These and other features of the present invention will be more clearly understood from the following detailed description taken in conjunction with the accompanying drawings. It is important to point out that the illustrations may not necessarily be drawn to scale, and that there may be other embodiments of the present invention which are not specifically illustrated.

Figure 1:
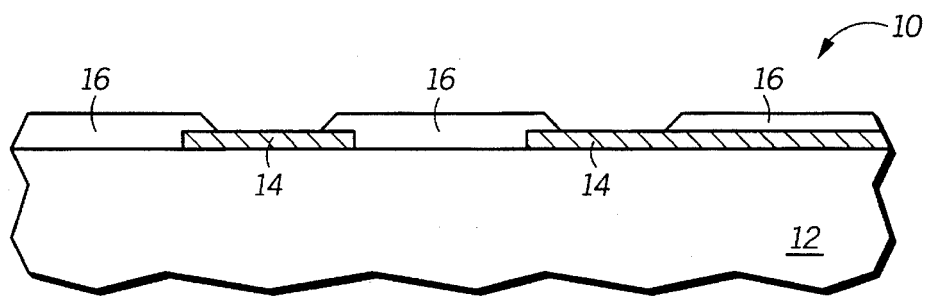
FIGS. 1–4 illustrate, in cross-section, a portion of a semiconductor device, and demonstrate a sequential process for forming conductive bumps on the semiconductor device in accordance with one embodiment of the present invention.

FIGS. 1–4 illustrate one process for forming conductive bumps on a semiconductor device 10 in accordance with the present invention. FIG. 1 illustrates a cross section of a portion of semiconductor device 10. Device 10 includes an insulating layer 12 formed over a desired semiconductor substrate (not shown). Insulating layer 12 may be formed of conventional semiconductor device insulating materials, such as phospho-silicate-glass (PSG), boron-phospho-silicate-glass (BPSG), silicon oxide from tetra-ethyl-ortho-silicate (TEOS), a spin-on-glass (SOG), or the like. Various conductive and insulating layers may exist between insulating layer 12 and an underlying semiconductor substrate (not shown), but are not illustrated since an understanding of these layers is not necessary for an understanding of the present invention. A metallization layer 14 is formed on insulating layer 12. Metallization layer 14 will typically be the final metallization layer of device 10, and will typically be formed of aluminum or an aluminum alloy. Overlying metallization layer 14 is a passivation layer 16, which is typically formed of one or a combination of silicon dioxide, PSG, BPSG, silicon nitride, and polyimide. Passivation layer 16 is patterned to expose portions of metallization layer 14 which serve as pads for making electrical I/O connections to the device. The device as illustrated in FIG. 1 may be fabricated using conventional semiconductor manufacturing technology; therefore, a discussion of fabrication steps to form the device is not included.

Device 10, as illustrated in FIG. 1, is a portion of an individual IC die, wherein the die is one of an array of similar die on a semiconductor wafer. The processes described hereinafter are performed upon the entire wafer, but for ease of illustration are only illustrated in reference to the portion of device 10 shown in FIG. 1.

Figure 2:
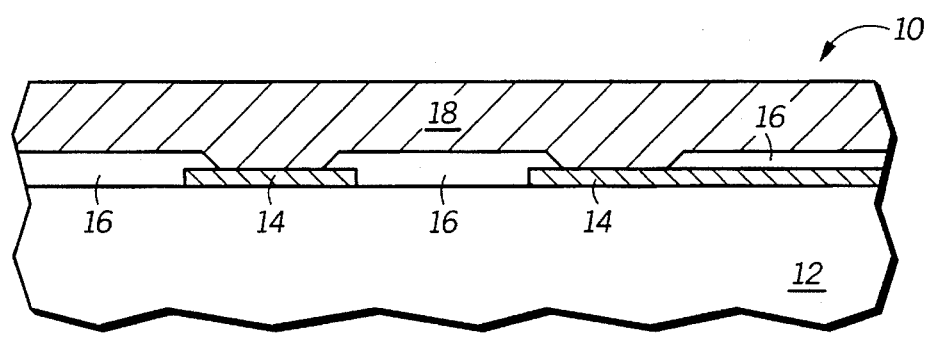

In accordance with the present invention, conductive bumps are formed on exposed pad portions of metallization layer 14 by first depositing an imageable conductive material 18, as illustrated in FIG. 2. In a preferred embodiment, conductive material 18 is an imageable acrylic based polymer material filled with conductive particles. The filled imageable conductive material is generally composed of from two to four principal components: a base radiation sensitive resin; electrically conductive filler particles; solvents; and radiation or photo-initiators; wherein the latter two components may not be needed in the material. A wide range of other additives may also be present, including, but not limited to, inhibitors, wetting agents, surfactants, colorants, opacifiers, coalescent agents, non-radiation sensitive polymers, polymer precursors, polymer adjuncts, flow control agents, leveling agents, and adhesion promoting agents. These additives are likely to be added for a wide range of processing and use improvements, including inhibition of polymer degradation during radiation imaging, enhancement of application methods, modification of the mechanical and thermal properties of the cured material, improvement in the leveling of the applied liquid, improving planarization of the cured film, and enhancing adhesion of the material to the underlying substrate phases.

Radiation sensitive resins systems suitable as the base component for imageable conductive material 18 includes a poly-methyl-methacrylate, which is a radiation sensitive thermoplastic material. Other suitable resin systems include poly-ethyl-methacrylates, poly-butyl-methacrylates, radiation sensitive vinyl polymers such as polystyrene and poly-chlorostyrene, poly-methyl-siloxane, poly-butene-sulfone, poly-methyl-isopropenyl ketone, poly-methyl-fluoro acrylate, acrylic modified epoxies, imageable polyimides, polyamides, nylon derivates, phenol formaldehyde (phenolic) resins, and other resin materials used as photoresists in circuit fabrication and photolithography and as solder masks in electroplating operations. Polymer systems other than those explicitly listed may also be suitable. The polymer may be in liquid form with no solvents present. In other instances, the polymer may need to be dissolved in an appropriate solvent in the formulation process, or prior to application, to establish an appropriate viscosity of the material for adequate application or deposition onto a wafer.

The conductive fillers within material 18 are in particulate form and provide the electrical conductivity of imageable conductive material 18. The particle morphology may be characterized as spheres, flakes, dendrites, amorphous, or any combination of these structures. Preferably, the fillers consists of metal particles, which may include particles of silver, palladium, silver-palladium alloys, nickel, copper, gold, lead-tin solder alloys, gold-plated nickel, nickel-plated copper, molybdenum, tungsten, nickel-plated molybdenum, nickel-plated tungsten, molybdenum or tungsten-plated first with nickel and then with gold, and rhodium-plated copper. Also, the particles may be formed of a composite, such as nickel-coated or plated glass spheres, gold-coated or plated glass spheres, or metal-coated or plated ceramic particles. Either one type of filler or a combination of fillers types can be used. To those skilled in the art, it is apparent that a wide range of materials may be considered as suitable fillers. Hence, the materials noted in no way limit the range of materials which may be used in practicing the present invention.

In choosing filler materials for use in an imageable conductive material, hardness of the filler material may be a consideration. The presence of hard and brittle particles, such as those made of tungsten, molybdenum, metal-coated tungsten or molybdenum, or ceramic particles, serves a beneficial purpose in addition to providing electrical conductivity. Hard or brittle particles may act to scrub or penetrate the surface of the metallization layer 14 during joining and subsequent power and temperature cycling. Such penetration and scrubbing will break through any oxides which may have formed on the surface of the pad metallization, thereby establishing and maintaining low contact resistance between the imageable conductive material 18 and metallization 14.

Another consideration for the fillers is the particle size distribution of the filler particles. The minimum particle size may extend from the colloidal range (approximately <0.1 µm) up to 100 µm, while the preferred range would range from approximately 2 µm to 30 µm. The filler content should range from approximately 50 volume percent to 85 volume percent of all the liquid components of the material. The filler content and particle size distribution will largely control the rheology of the imageable conductive material. The rheology must be controlled or adjusted for the type of method used to apply the material to the wafer and for the desired coating thickness.

In accordance with the present invention, imageable conductive material 18 may be applied by a number of methods, including spin-coating, curtain coating, spraying, roller coating, screen printing, and thin film application. Application methods may also include a combination of these and other methods, for example, spraying and then spinning, or screen printing and then spinning. Generally, the spin coating, curtain coating, and spraying methods will be used for imageable conductive materials in a liquid form and having rather low viscosity, in which case the material should be baked after application onto device 10 to remove solvents (if present) and partially cure the material to mechanically stabilize the imageable conductive material 18. Higher viscosity materials may be applied using screen printing, with the possible use of a post-screening operation where a spinning operation is used to improve leveling and coating planarization. A film of the material could also be applied to device 10. A film of the conductive imageable material may be formed by first coating a flat surface with a liquid form of the imageable conductive material, heating the liquid to evaporate solvents (if present), and heating to partially cure the material. The dried and cured film would then be peeled from the substrate for later use. The peeled film may then be applied to device 10 by laminating it to the wafer with pressure and heat. This may be performed in a vacuum to eliminate interfacial voids. In general, imageable conductive material should be applied or deposited to a thickness of between 5 µm to 500 µm, and preferably from 5 µm to 250 µm.

After application and any necessary curing operations, imageable conductive material 18 preferably has a filler content ranging from approximately 70 volume percent to 85 volume percent. The filler level is directly proportional to electrical conductivity and to the modulus of elasticity of the material. If the filler loading level is too high (and consequently the base polymer content is too low), the adhesion to the bond pads of the die will decrease. However, this negative effect can be offset by the use of an underfill material between device 10 and the system to which it will subsequently be connected, as discussed below. If the modulus of elasticity of conductive bumps formed by imageable conductive material 18 is too high, the elastic stress compliance afforded by bumps formed from the imageable conductive material will be reduced. Stress compliance is desirable due to the stresses exerted across joined interfaces of materials with dissimilar thermal expansions. Ideally, the coefficient of thermal expansion (CTE) of device 10 should match the CTE of the member to which it is connected. However, in reality, the CTE difference will be between 3.5 and 13 parts per million (ppm/°C.), assuming the bulk material of device 10 is silicon (CTE=3 ppm/°C.) and the member to which the device is connected is an aluminum-oxide based ceramic (CTE=6.5 ppm /°°C.) or an epoxy-glass printed circuit board (CTE=16 ppm/°C.). The larger the CTE mismatch between the two members to be joined, the greater the resulting stress. Again, however, a difference in CTE's can be offset by use of an appropriate underfill material since the underfill material will serve as the principal load bearing member in the system after the full joining process is completed.

Figure 3:
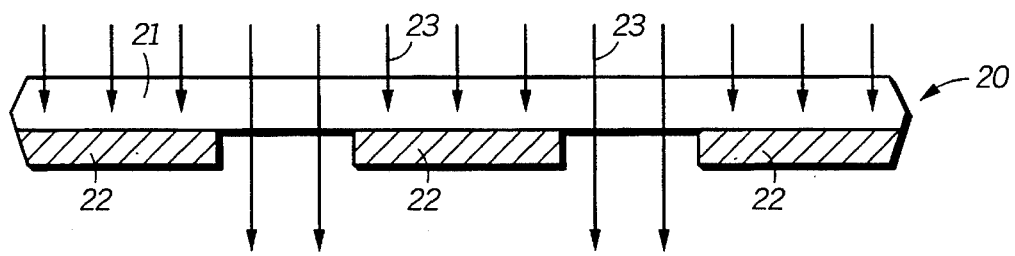
Figure 4:
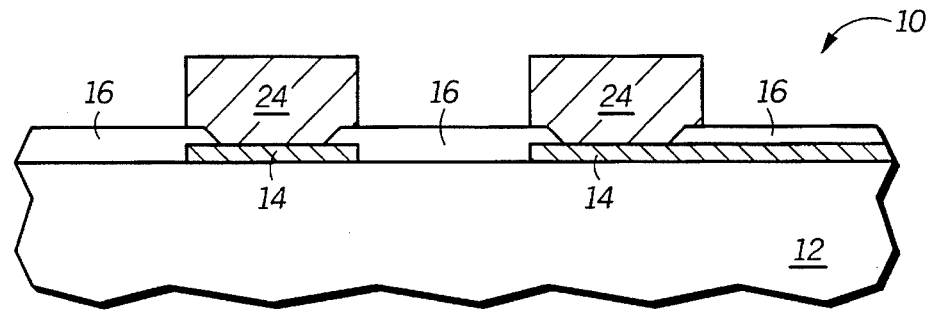

After applying imageable conductive material 18 to device 10 as described above, the material undergoes a radiation treatment. As illustrated in FIG. 3, a mask 20 is aligned to device 10, either in contact with, or in proximity to, the dried and partially cured imageable conductive material 18. Mask 20 may be a transparent substrate, such as glass, with an opaque pattern formed upon it, or it may be an opaque material with holes formed in it. FIG. 3 illustrates the former, wherein the mask includes a transparent substrate 21 having an opaque material 22, such as chromium or chromium oxide, patterned thereon in a pattern corresponding to the desired bump pattern. After mask alignment, device 10 is exposed to actinic radiation 23, which passes through transparent portions of mask 20. Opaque portions of mask 20 block the radiation. As illustrated in FIGS. 3 and 4, imageable conductive material 18 is a negative-acting material (i.e. the imageable resin component of the material is a negatively imageable). The portions of the imageable conductive material exposed to radiation become cross-linked by radiation 23. Suitable exposure wavelengths to do the cross-linking are governed by base imageable resin material (as determined by the resin manufacturer). Suitable exposure times will depend upon the filler type, filler morphology, and filler content in the film, but in general will be considerably longer than exposure times for the base resin without such fillers.

After exposing device 10 and portions of conductive material 18 to radiation, the imageable conductive material is developed in an aqueous solution to form conductive bumps 24, as illustrated in FIG. 4. Because a negative-acting resist material was used in reference to FIG. 3, developing results in removal of unexposed portions of conductive material 18. Developing negative-acting materials is typically done using an organic solvent which dissolves the unexposed material. Substantially columnar conductive polymer I/O bumps 24 are left on the surface of device 10 after the organic solvent development process. Negative-acting materials are often characterized as having a slightly tapered sidewall after the development process, so the design of mask 20 may need to compensate for any resulting taper. Bumps 24 formed of conductive polymer regions may be circular, or polygonal, as desired. The shape of the bumps is defined by the patterning of mask 20. The size of bumps 24 may range in diameter from 5 μm to 500 μm, and in height from 5 μm to 500 μm. Preferably, diameters and heights will range from 5 μm to 250 μm.

Figure 5:
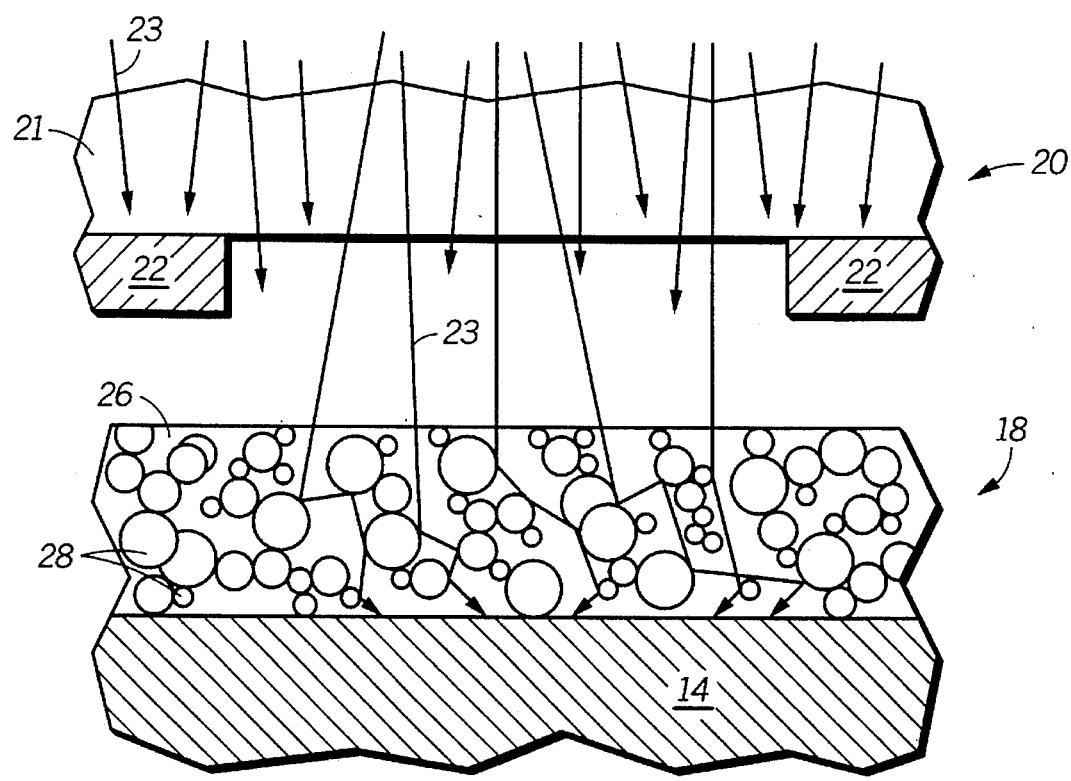
FIG. 5 illustrates, in cross-section, an exploded view of a portion of the device as shown in FIG. 3.

FIG. 5 is an exploded detail of the cross section of device 10 after coating and partially curing the imageable conductive material 18 and during exposure of the material to radiation. As illustrated, mask 20 is aligned over the device and rays of actinic radiation having an appropriate wavelength pass through transparent portions of mask 20 and into the metal filled polymer film comprising material 18. The exploded view of material 18 provides a better understanding of the composition of the material. An imageable resin 26, being a matrix polymer, is substantially transparent to the impinging radiation. Radiation rays 23 are not perfectly collimated, so a degree of non-parallelism exists between the rays. Accordingly, the angle of incidence of rays 23 will vary. Some incident rays will reflect off the interface of the imageable resin 26, while a majority of the rays will pass through the resin and reflect off conductive filler particles 28. Since the conductive filler particles will likely reflect most rays, the rays will be continually reflected through the material, penetrating deeper into the resin, until finally reaching the surface of metallization layer 14. At this time, reflection of radiation rays off the interface of imageable conductive material 18 and metallization layer 14 occurs, providing a second opportunity for interaction with radiation sensitive components of imageable resin 26. Despite the high level of conductive filler particles 28 in imageable conductive material 18, high intensity radiation sources are able to penetrate and react with the radiation sensitive resin 26 with the aforesaid volume percentages. In some instances it may be desired to add a photo-initiator compound to resin 26 during the initial formulation. A photo-initiator will react with the impinging radiation, forming free radicals and releasing thermal energy, both of which assist in the reaction within the resin. Because the conductive filler particles are reflective, radiation may also be reflected in a lateral direction, thereby causing chemical reactions in material 18 beyond the exposure window in mask 20. The design of mask 20 may be adjusted to accommodate such a variation in the size of the exposed portion the imageable conductive material, although the relatively course feature sizes of conductive bumps disclosed herein may eliminate the need for such a mask adjustment.

Figure 6:
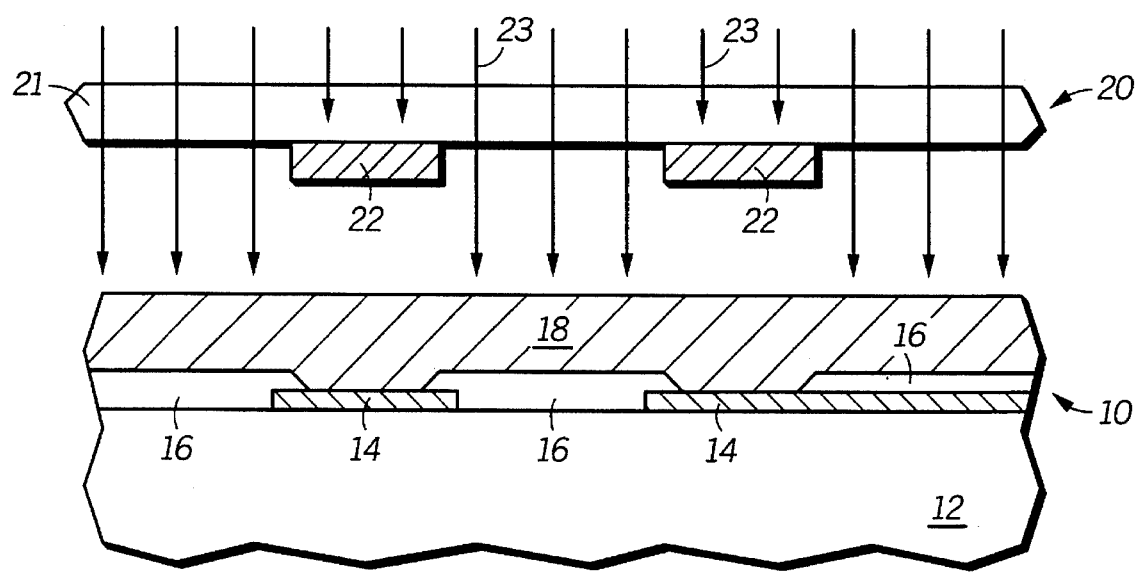
FIG. 6 illustrates, in cross-section, an alternative process for forming conductive bumps in place of the process shown in FIG. 3, and also in accordance with the present invention.

FIG. 6 illustrates how the present invention may be practiced using a positively acting imageable conductive material (i.e. wherein the imageable resin component of the material is positively imageable). With a positive-acting imageable conductive material 18, chemicals are released in the polymer upon exposure to radiation which permit the exposed material to be readily dissolved in the development process (rather than dissolving the unexposed portions, as in the case of a negatively imageable material). In using a material with a positive resist component, the opaque portions 22 in the mask 20 are patterned such that the transparent portions 21 correspond to the material which is to be removed during the development process. Radiation rays 23 penetrate the imageable conductive material 18, releasing chemicals which degrade the structure of the polymer. The subsequent development step dissolves the unexposed material, leaving the substantially columnar bumps 24, like those illustrated in FIG. 4. Aqueous tetra-methylamine solutions or other pH-basic solutions are often used for developing positive-acting materials. Positively imaged materials commonly offer straighter sidewalls than negatively imaged materials in the absence of filler particles. The presence of the fillers particles will minimize the difference in the sidewalls of etched features formed in positive or negative acting materials. While a positive material may be more desirable due to environmental and waste management considerations, the mechanical strength and stability of the positive-acting material may be less than that of a negative-acting material, wherein cross-linking has occurred in the material.

Figure 7:
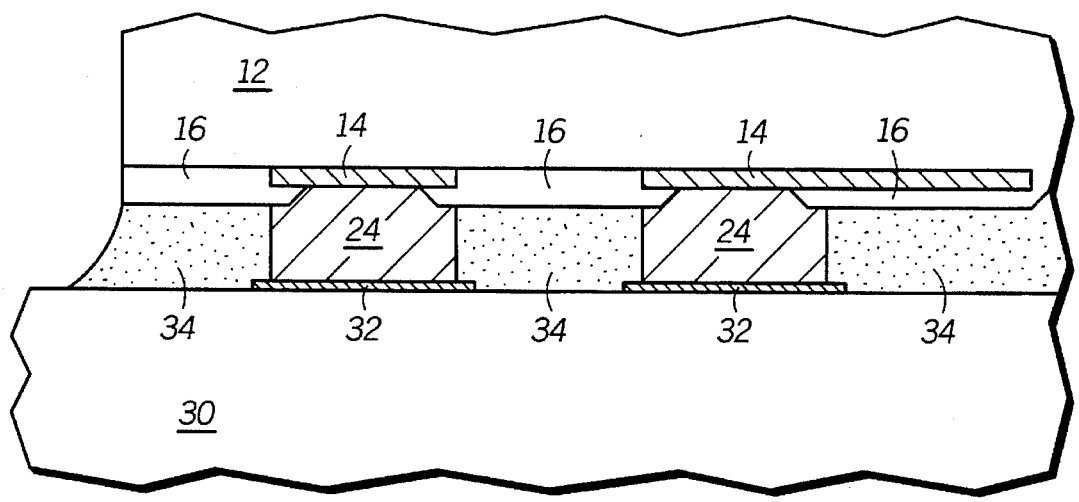
FIG. 7 illustrates, in cross-section, the device of FIG. 4 as it may be joined to a system-level substrate.

After conductive bumps 24 are formed in accordance with the present invention, device 10 is interconnected to the next level of interconnect in a typical electrical system, as illustrated in FIG. 7. In a typical application, the bumped device 10 will be electrically connected to a substrate 30, such as a circuitized multilayer ceramic or an epoxy-glass printed circuit board. Conductive bumps may be joined to a matching pattern of conductive pads 32 formed on the substrate. Joining may be accomplished by a variety of methods which include a joining stage and a curing stage, and preferably include application of an underfill material 34. In one connection method, device 10 is oriented with bumps 24 facing substrate 30, and the device is precisely placed onto the substrate such that the bumps are in contact with the desired pads of the substrate. The assembly of device 10 and substrate 30 is then heated to soften the bumps and to allow the bumps to wet and adhere to the substrate pads. The heating may be accomplished using either a conventional oven or a rapid heating by a robotic end effector tool used to pick up and position the die (neither of which are shown). During the heating, a controlled load may be applied to the back of device 10, allowing the gap between device 10 and substrate 30 to diminish to the desired height. After joining, a final cure of conductive bumps may be performed using either the oven or the rapid heating effector tool.

After joining device 10 to substrate 30, an electrically insulative underfill material 34 may be dispensed about the perimeter of device 10. The underfill material is drawn into any gaps between device 10 and substrate 30 due to surface tension capillary effects, thereby completely filling the area between the device and the substrate, as illustrated in FIG. 7. After underfilling, the device 10 and substrate 30 assembly are again heated to cure the underfill material. Alternatively, underfill material 34 may be cured at room temperature if formulated with appropriate resin and accelerator compounds. As another alternative, the above joining procedure can be accomplished without fully curing conductive bumps 24 prior to dispensing the underfill material. Instead, both the conductive bumps 24 and underfill material 34 could be simultaneously cured in the same operation.

The use of underfill material 34 is advantageous in practicing the present invention for several reasons. As mentioned earlier, an underfill material can compensate for CTE and modulus of elasticity differences between device 10 and substrate 30, resulting in lower stress. Accordingly, using an underfill permits use of imageable conductive materials which have low strength and high modulus which otherwise may not have been suitable. Another advantage is that the underfill material is typically formulated such that curing the underfill material will be accompanied by a reduction in the free volume of the underfill system polymer phase. The volume reduction of the underfill material 34 causes stresses to develop, which attempt to bring device 10 and the underlying substrate 30 closer together, putting bumps 24 and the pads 32 into compression. Using an underfill material having a CTE less than that of the imageable conductive material also helps to maintain a compressive state, even during thermal excursions. Depending upon the mechanical properties of the bumps, the underfill cure temperature, and the filler level, this compressive stress may cause the cross-sectional shape of bumps 24 to change, such that the bump sidewalls would bow out and appear barrel shaped. The compressive force between the bumps and pads establishes good electrical conductivity through the interconnection, maintaining low contact resistance which should range from approximately 10 to 100 milli-ohms, depending on the cross-section of the bumps, the heights of the bumps, and the size of the pads contacted on the substrate.

Figure 8:
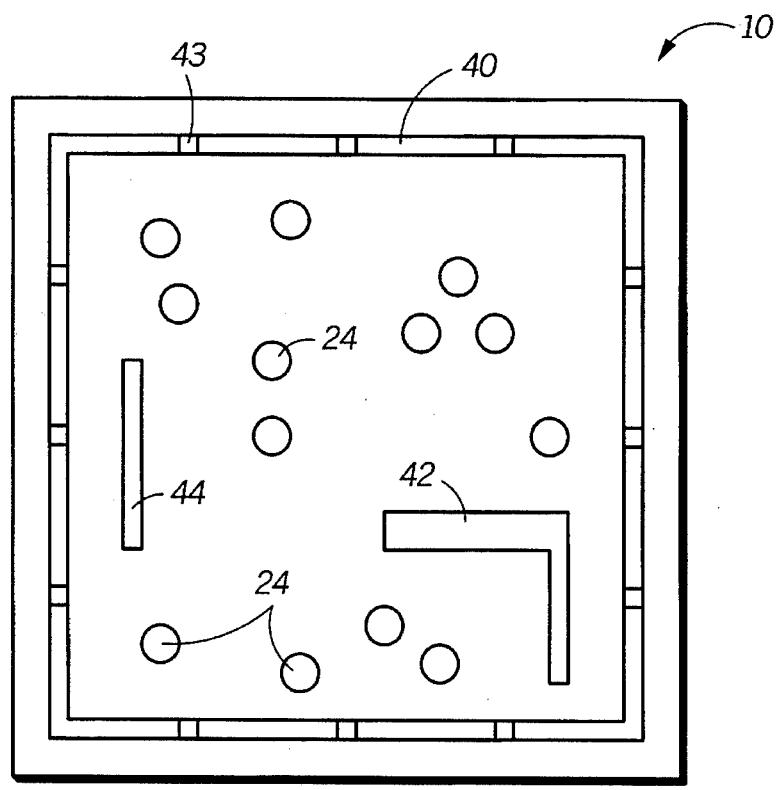
FIG. 8 is a top view of a junction surface of the device of FIG. 4, illustrating conductive bumps and other conductive members formed in accordance with the present invention.

FIG. 8 illustrates the surface of device 10 after the formation of conductive bumps 24 in accordance with the present invention, and after the device has been singulated from the wafer form. FIG. 8 demonstrates that the present invention may be practiced to form conductive members other than conductive bumps used to connect I/O pads of the device to a system level interconnect. For example, the imageable conductive material can be used to form an electromagnetic interference (EMI) shield ring 40 around the perimeter of the device. Shield ring 40 is connected to the desired voltage connections, typically an isolated ground potential, on device 10, and will be connected to the appropriate voltage connections on the interconnection substrate 30. Shield ring 40 may have openings 43 which permit an underfill encapsulant (not shown in FIG. 8), which is dispensed about the perimeter of the die, to flow into the free space between the die face and the opposing substrate surface. A low noise ground bus 42, and a power bus 44, formed from the imageable conductive material is also shown in FIG. 8. Formation of shield ring 40 and buses 42 and 44 is achieved at the same time as formation of the conductive bumps 24. The only difference in fabrication is that the mask used to define the bumps (e.g. mask 20 in FIGS. 4 and 6) is patterned to allow exposure (or non-exposure) of the other features in addition to the bumps.

The foregoing description and illustrations contained herein demonstrate many of the advantages associated with the present invention. In particular, it has been revealed that conductive bumps may be formed on a semiconductor device without many of the disadvantages associated with prior art processes. For example, the present invention allows for the formation of conductive bumps without the large capital investment required for the formation of solder bumps using typical evaporative or electroplating techniques. Furthermore, the unique technical knowledge required to practice the evaporative or electroplating techniques is not needed. In addition, the costly and time consuming processes required in the deposition of layered thin film barrier metals needed for evaporated or electroplated bumps can be eliminated, resulting in lower bumping costs and shorter manufacturing cycle times. Another advantage of the present invention is the ability to form very precise bump shapes and sizes in very controlled locations. The imageable nature of the conductive polymer allows this processing advantage over that offered by the screen printing of conductive epoxies, due to the relatively coarse dimensional control provided by screen printing.

Thus, it is apparent that there has been provided, in accordance with the invention, a method for forming conductive bumps that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention can be practiced using a variety of forms of radiation, including visible or photo radiation, x-ray radiation, electron beam radiation, or other forms of ionizing radiation. In addition, the invention is not limited to the formation of any particular shape or size of conductive bumps. Moreover, subsequent heat treatments may change the shape of the bumps from that originally defined. It is also important to note that using the present invention for forming conductive members other than I/O bumps is not limited by the shapes herein illustrated. Conductive members may take the form of continuous lines or large area contacts that are substantially larger than the bumps used for signal interconnection. Furthermore, the present invention is not limited to the sequence of performing the various steps described herein, especially the bonding, heating, and curing steps for the imageable conductive material and underfill material. Therefore, it is intended that this invention encompass all such variations and modifications as fall within the scope of the appended claims.

I claim:

1. A method for forming conductive bumps on a semiconductor die, the method comprising the steps of:
   providing a semiconductor die having a plurality of metal pads;
   depositing a conductive material on the semiconductor die and in electrical contact with the plurality of metal pads, wherein the conductive material is imageable by actinic radiation;
   exposing portions of the conductive material to actinic radiation to create exposed portions and unexposed portions of the conductive material; and
   removing one of either:
      a) the exposed portions of the conductive material, and
      b) the unexposed portions of the conductive material;
   wherein as a result of removing, remaining portions of the conductive material are created and wherein the remaining portions form a plurality of conductive bumps on the plurality of metal pads.

2. The method of claim 1 wherein the step of removing comprises removing the exposed portions of the conductive material, and wherein the conductive bumps are formed by the unexposed portions of the conductive material.

3. The method of claim 1 wherein the step of depositing a conductive material comprises depositing a conductive material comprised of an imageable acrylic resin filled with a plurality of conductive particles.

4. The method of claim 3 wherein the step of depositing a conductive material comprises depositing a conductive material comprised of an imageable resin, and wherein the imageable resin is a poly-methyl-methacrylate.

5. The method of claim 3 wherein the step of depositing a conductive material comprises depositing a conductive material filled with a plurality of particles comprised of metal.

6. The method of claim 1 further comprising the step of curing the conductive material after the step of depositing and before the step of exposing.

7. A method for forming conductive bumps on a semiconductor die, the method comprising the steps of:

provviding a semiconductor substrate having a metallization layer and an insulating layer, wherein the insulating layer is patterned to create a pattern of exposed portions of the metallization layer;

depositing an imageable conductive material on the insulating layer and in contact with the exposed portions of the metallization layer;

exposing selected portions of the imageable conductive material to actinic radiation, thereby chemically altering the selected portions of the imageable conductive material; and developing the imageable conductive material to dissolve portions of the imageable conductive material, leaving a pattern of the imageable conductive material corresponding to the pattern of exposed portions of the metallization layer.

8. The method of claim 7 wherein the step of developing comprises developing the imageable conductive material to dissolve the selected portions of the imageable conductive material.

9. The method of claim 7 wherein the step of depositing an imageable conductive material comprises depositing an imageable conductive material comprised of an imageable acrylic resin filled with a plurality of conductive particles.

10. The method of claim 9 wherein the step of depositing an imageable conductive material comprises depositing an imageable conductive material comprised of an imageable resin, and wherein the imageable resin is poly-methyl-methacrylate.

11. The method of claim 9 wherein the step of depositing an imageable conductive material comprises depositing an imageable conductive material further comprised of a solvent.

12. The method of claim 11 wherein the step of depositing comprises depositing by a method selected from a group consisting of spin coating, screen printing, stencil printing, and curtain coating.

13. The method of claim 11 further comprising the step of curing the imageable conductive material after the step of depositing and before the step of exposing to drive off at least some of the solvent.

14. A method for forming conductive bumps on a semiconductor device, comprising the steps of:

providing a semiconductor die having input and output terminal sites;

depositing an imageable material comprised of a resin filled with metallic particles such that the imageable material is in contact with the input and output terminal sites;

providing a mask having a pattern correlating to the input and output terminal sites;

transmitting actinic radiation through the mask to selectively alter portions of the imageable material; and selectively removing first portions of the imageable material such that second portions of the imageable material remain and are in electrical contact with the input and output terminal sites.

15. The method of claim 14 wherein the step of selectively removing comprises developing the imageable material in an aqueous solution.

16. The method of claim 14 further comprising the steps of:

providing a system substrate having contact pads corresponding to the input and output terminal sites; and joining the semiconductor die to the system substrate such that the second portions of the imageable material are aligned to and in contact with the contact pads of the system substrate.

17. The method of claim 16 further comprising the step of:

dispensing an electrically insulating underfill material between the semiconductor die and the system substrate.

* * * * *